United States Patent
Ikeda et al.

(10) Patent No.: US 9,735,337 B2
(45) Date of Patent: Aug. 15, 2017

(54) PIEZOELECTRIC ACTUATOR

(71) Applicant: TDK CORPORATION, Tokyo (JP)

(72) Inventors: Yoshiki Ikeda, Tokyo (JP); Keiji Oguchi, Tokyo (JP)

(73) Assignee: TDK CORPORATION, Tokyo (JP)

( * ) Notice: Subject to any disclaimer, the term of this patent is extended or adjusted under 35 U.S.C. 154(b) by 427 days.

(21) Appl. No.: 14/335,337

(22) Filed: Jul. 18, 2014

(65) Prior Publication Data

US 2015/0028723 A1    Jan. 29, 2015

(30) Foreign Application Priority Data

Jul. 25, 2013  (JP) .................................. 2013-154518

(51) Int. Cl.

| | |
|---|---|
| *H01L 41/04* | (2006.01) |
| *H01L 41/047* | (2006.01) |
| *H02N 2/00* | (2006.01) |
| *H02N 2/02* | (2006.01) |
| *H01L 41/09* | (2006.01) |

(52) U.S. Cl.
CPC ...... *H01L 41/0471* (2013.01); *H01L 41/0474* (2013.01); *H01L 41/0913* (2013.01); *H02N 2/004* (2013.01); *H02N 2/026* (2013.01)

(58) Field of Classification Search
CPC ........................ H01L 41/0471; H01L 41/0474
USPC ............ 310/328, 339, 313 A–313 D, 323.16
See application file for complete search history.

(56) References Cited

U.S. PATENT DOCUMENTS

| | | | |
|---|---|---|---|
| 8,269,398 B2* | 9/2012 | Miyano | ............... H01L 41/0471 310/323.02 |
| 8,390,170 B2* | 3/2013 | Miyano | ............... H01L 41/0471 310/323.02 |
| 2008/0093953 A1 | 4/2008 | Koc et al. | |

FOREIGN PATENT DOCUMENTS

JP   A-2008-99549   4/2008

* cited by examiner

*Primary Examiner* — Thomas Dougherty
*Assistant Examiner* — Karen B Addison
(74) *Attorney, Agent, or Firm* — Oliff PLC (57) ABSTRACT

A piezoelectric actuator comprises a substantially rectangular parallelepiped piezoelectric element. One outer surface of the piezoelectric element includes a first region, and a second region located such as to project from the first region and to overlap a region corresponding to an active portion in the one outer surface. The second region has a flat surface configured to come into contact with a body to be driven and to generate a frictional force therewith. The flat surface is shorter in a longitudinal direction of the piezoelectric element than in a lateral direction thereof. The flat surface is longer in the longitudinal direction of the piezoelectric element at a lateral center region thereof than at a lateral end region thereof.

3 Claims, 10 Drawing Sheets

PIEZOELECTRIC ACTUATOR

BACKGROUND OF THE INVENTION

Field of the Invention

The present invention relates to a piezoelectric actuator.

Related Background Art

Known as a piezoelectric actuator is one comprising a piezoelectric body adapted to simultaneously generate first and two vibration modes in response to an electric power applied thereto and a frictional member which is separate from the piezoelectric body and partly secured to a concave portion formed as a depression on one side of the piezoelectric body (see, for example, Japanese Patent Application Laid-Open No. 2008-99549).

SUMMARY OF THE INVENTION

The piezoelectric element (piezoelectric body) of the piezoelectric actuator disclosed in Japanese Patent Application Laid-Open No. 2008-99549 has active and inactive portions which are adapted to be displaced and not, respectively, when a voltage is applied thereto. When a voltage is applied to the piezoelectric element, the active portion is displaced. When the active portion is displaced, a frictional member secured to the piezoelectric body comes into contact with a body to be driven and generates a frictional force therewith. According to thus generated frictional force, the piezoelectric element drives the body to be driven. The piezoelectric actuator driving the body to be driven by using the frictional force generated when the piezoelectric element and the body to be driven come into contact with each other has been required to further improve the driving force.

It is therefore an object of the present invention to provide a piezoelectric actuator having a further improved driving force.

The piezoelectric actuator in accordance with one aspect of the present invention comprises a substantially rectangular parallelepiped piezoelectric element configured to generate first and second vibration modes simultaneously with each other in response to a voltage applied thereto; the piezoelectric element having an active portion located between a plurality of inner electrodes arranged in the piezoelectric element and configured to be displaced in response to a voltage applied thereto; one outer surface of the piezoelectric element including a first region, and a second region located such as to project from the first region and to overlap a region corresponding to the active portion in the one outer surface; the second region having a flat surface configured to come into contact with a body to be driven and generate a frictional force therewith; the flat surface being shorter in a longitudinal direction of the piezoelectric element than in a lateral direction thereof; and the flat surface being longer in the longitudinal direction of the piezoelectric element at a lateral center region thereof than at a lateral end region thereof.

In the piezoelectric actuator in accordance with one aspect of the present invention, the second region has the above-mentioned flat surface and is located such as to overlap a region corresponding to the active portion in one outer surface. Therefore, the second region includes a region generating a relatively large displacement in response to a voltage applied thereto, the region being as a broad area. This makes the piezoelectric element and the body to be driven come into contact with each other by a broad area and generate a large frictional force. A lateral end region of the flat surface is located in an inactive portion in a lateral direction of the piezoelectric element or laterally nearer to the inactive portion than is the center region of the flat surface. The inactive portion is not displaced by the voltage applied thereto and thus functions to inhibit the second region from being displaced. Since the flat surface is longitudinally shorter at the lateral end region than at the lateral center region, the region inhibiting the piezoelectric element from being displaced has a relatively small area. Therefore, the second region having the above-mentioned flat surface improves the driving force of the piezoelectric actuator.

In the piezoelectric actuator in accordance with one aspect of the present invention, the flat surface may have a lateral length equal to or shorter than that of the active portion. In this case, the flat surface is located inside of the active portion as seen from a direction orthogonal to the one outer surface. This can restrain the lateral end region of the flat surface from inhibiting the piezoelectric element from being displaced.

In the piezoelectric actuator in accordance with one aspect of the present invention, the second region may overlap a center of the active portion as seen from a direction orthogonal to the one outer surface. The center of the active portion is a position yielding the greatest displacement in response to the voltage applied thereto. When the second region overlaps the center of the active portion, the displacement of the second region generated by the voltage applied thereto increases.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENTS

In the following, preferred embodiments of the present invention will be explained in detail with reference to the accompanying drawings. In the explanation, the same constituents or those having the same functions will be referred to with the same signs, while omitting their overlapping descriptions.

Figure 1:
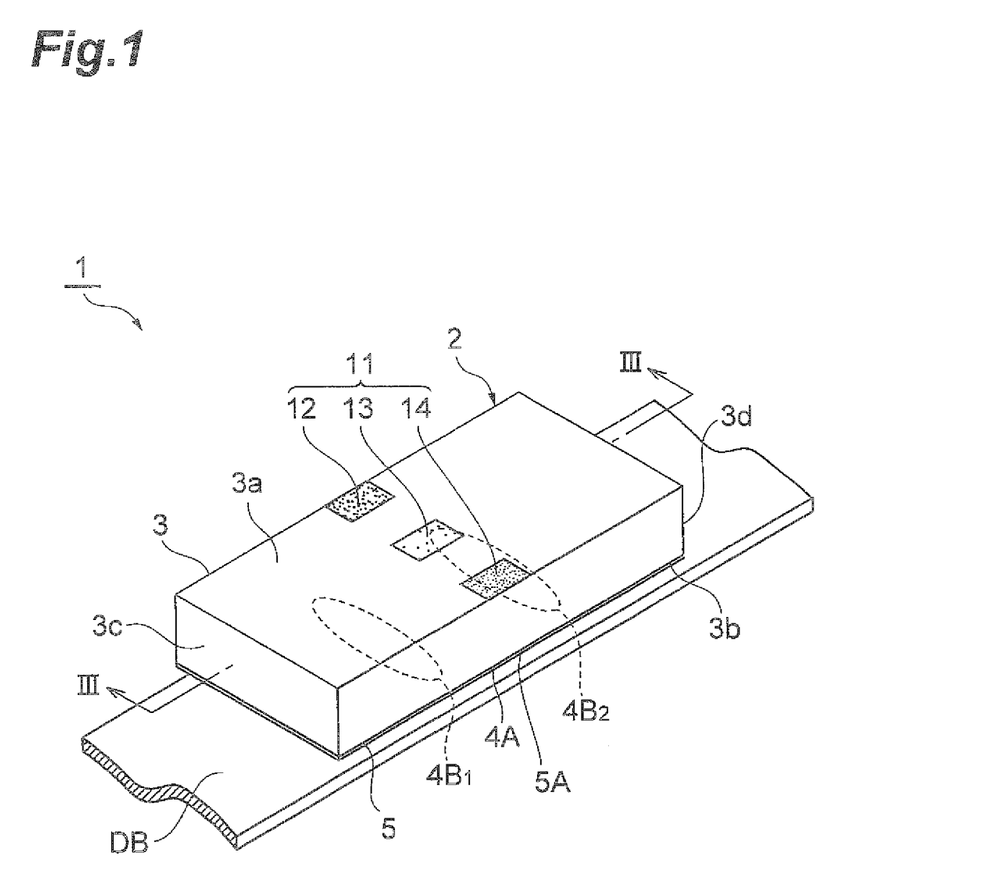
FIG. 1 is a perspective view of a multilayer piezoelectric actuator in accordance with an embodiment.
Figure 2:
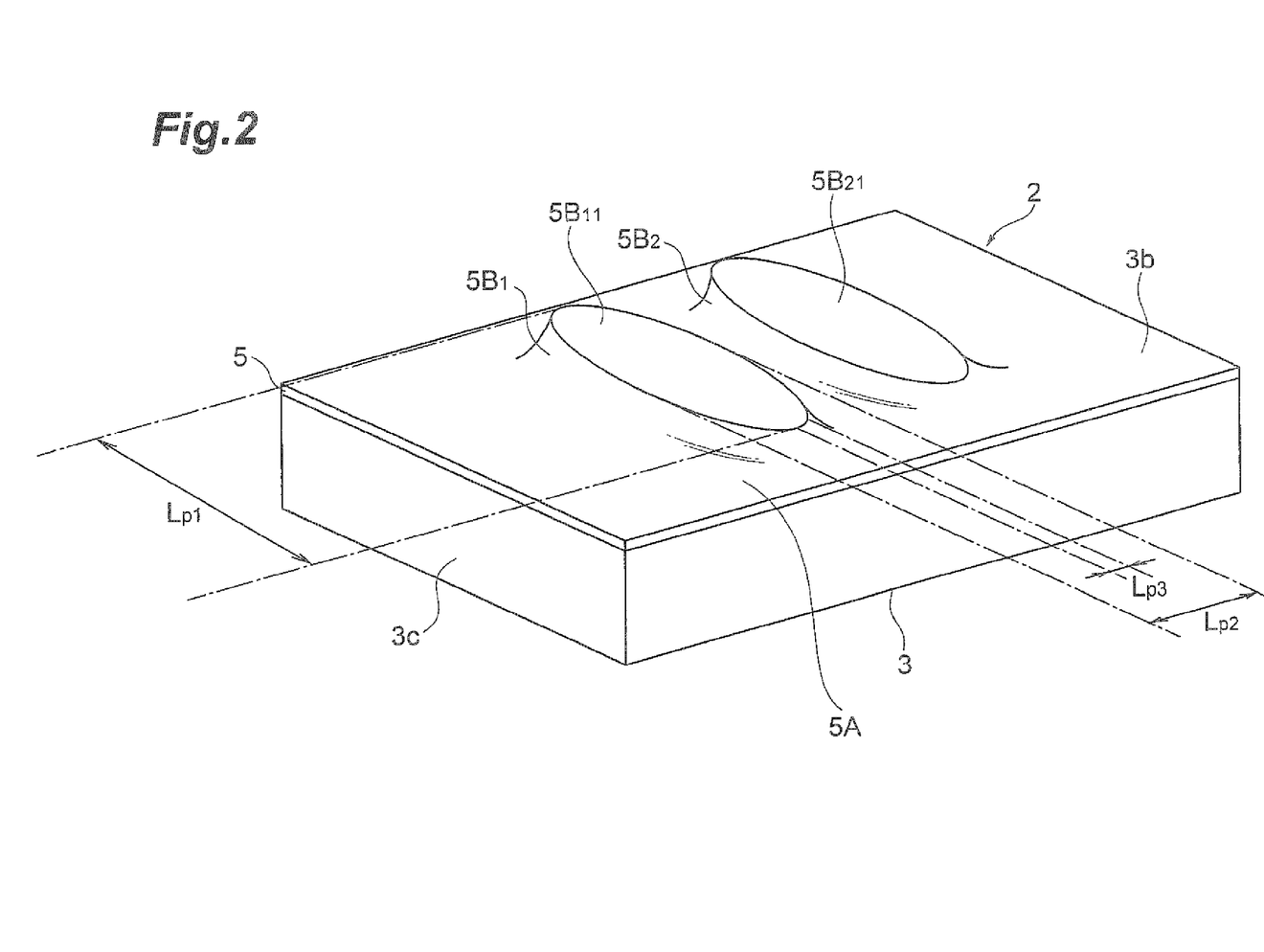
FIG. 2 is a perspective view of a piezoelectric element.
Figure 3:
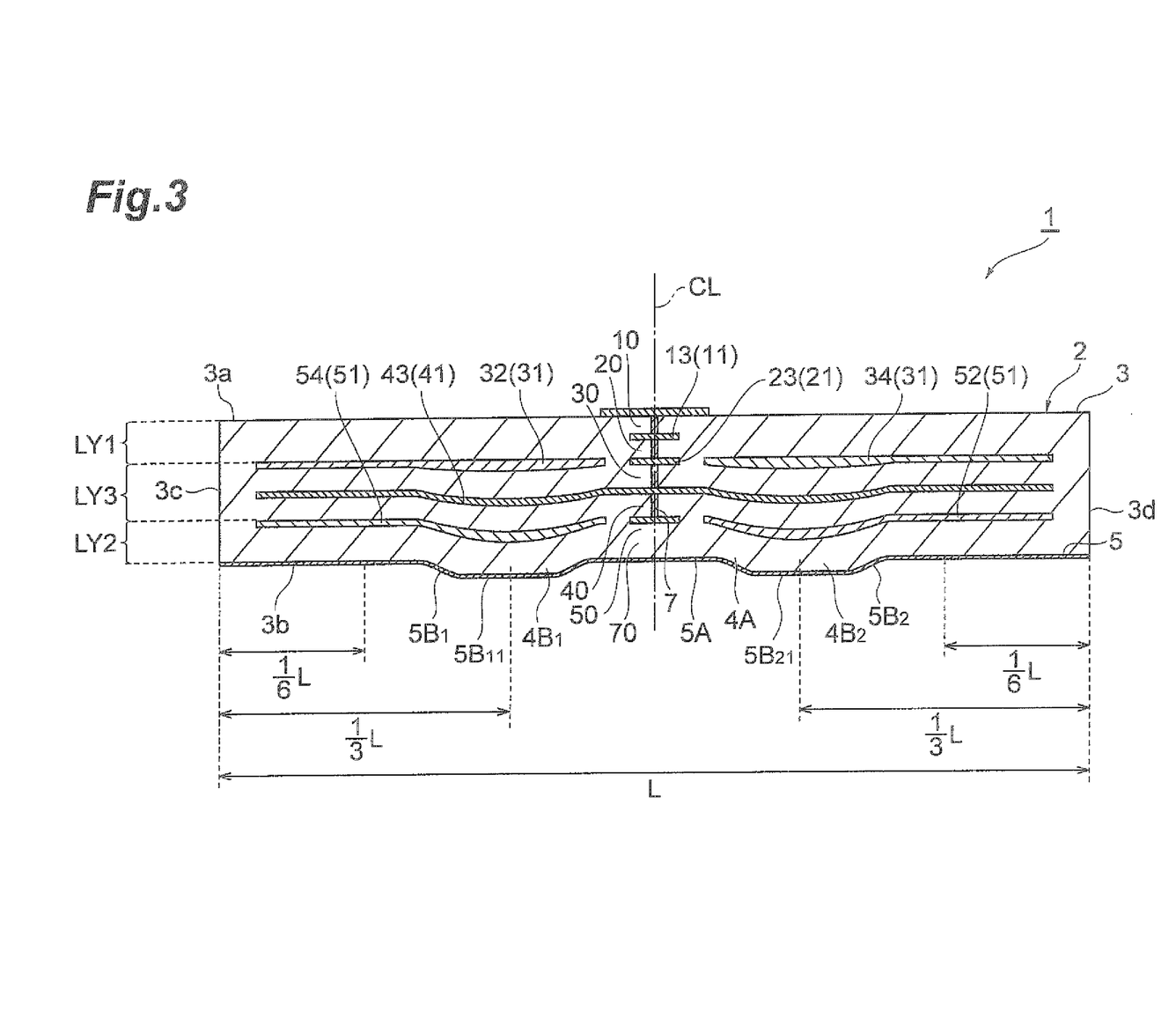
FIG. 3 is a sectional view taken along the line III-III illustrated in FIG. 1.
Figure 4:
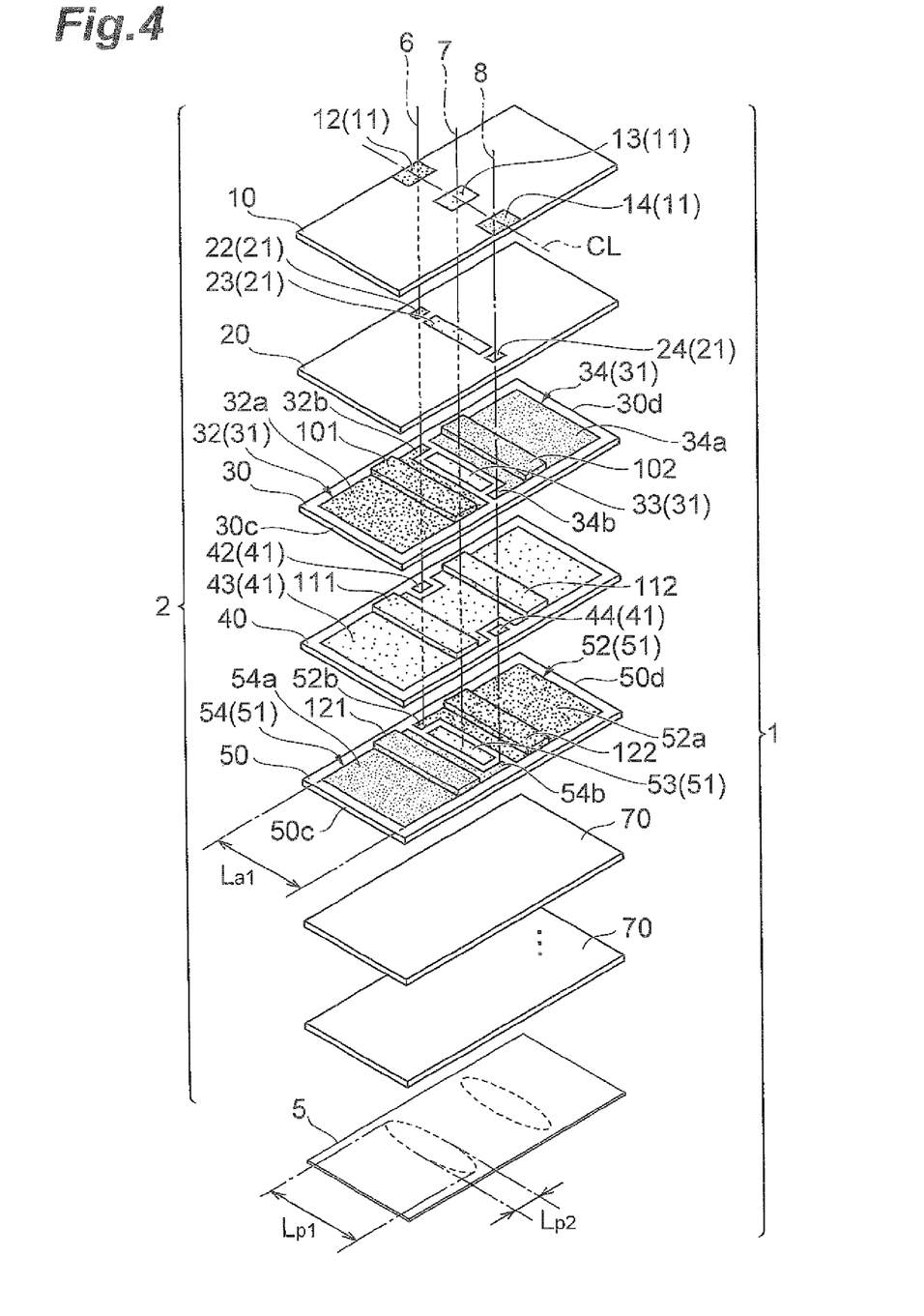
FIG. 4 is an exploded perspective view of the multilayer piezoelectric actuator illustrated in FIG. 1.

With reference to FIGS. 1 to 4, the structure of the multilayer piezoelectric actuator in accordance with an embodiment will be explained. FIG. 1 is a perspective view of the multilayer piezoelectric actuator in accordance with this embodiment. FIG. 2 is a perspective view of a piezoelectric element. FIG. 3 is a sectional view taken along the line III-III illustrated in FIG. 1. FIG. 4 is an exploded perspective view of the multilayer piezoelectric actuator illustrated in FIG. 1. FIGS. 3 and 4 depict a center line CL by a dash-single-dot line at the longitudinal center of the multilayer piezoelectric actuator. In FIG. 4, a through-hole conductor is assumed to be formed at a position where a vertically extending dash-single-dot line passes, while a through-hole is omitted because it is very small.

As shown in FIG. 1, the multilayer piezoelectric actuator 1 functions to be displaced in response to an AC voltage applied thereto, so as to move a body to be driven DB (e.g., rotor). The multilayer piezoelectric actuator 1 comprises a substantially rectangular parallelepiped piezoelectric element 2 formed by laminating and integrating a plurality of piezoelectric layers together. The piezoelectric element 2 has a multilayer portion 3 and a protective film 5.

The multilayer portion 3 of the piezoelectric element 2 has a rectangular first principal surface (upper face in FIG. 1) $3a$ and a rectangular second principal surface (lower face in FIG. 1) $3b$. In the following explanation, the longer- and shorter-side directions of the first and second principal surfaces $3a$, $3b$ and the direction along which the first and second principal surfaces $3a$, $3b$ oppose each other, i.e., the laminating direction of piezoelectric layers, will be referred to as longitudinal, lateral, and thickness directions of the multilayer portion 3 (piezoelectric element 2), respectively. The multilayer portion 3 is set to have sizes on the order of 1 to 20 mm, 1 to 10 mm, and 0.2 to 5 mm in the longitudinal, width, and thickness directions, respectively. In this embodiment, the lateral direction coincides with a width direction, and the longitudinal direction extends perpendicular to the lateral direction.

An outer electrode layer 11 is disposed at the longitudinal center position of the first principal surface $3a$ of the multilayer portion 3. The outer electrode layer 11 serves as terminal electrodes when mounting another external device thereon. The outer electrode layer 11 is arranged in the lateral direction at the longitudinal center position of the first principal surface $3a$. The outer electrode layer 11 includes a first outer electrode 12, a ground outer electrode 13, and a second outer electrode 14 which are electrically insulated from each other on the first principal surface $3a$.

The first outer electrode 12 is located on one end side of the lateral direction and has a rectangular form. The first outer electrode 12 is connected to a voltage output terminal of the external device. The ground outer electrode 13 is located at substantially the center in the lateral direction and has a rectangular form. The ground outer electrode 13 is connected to a ground terminal of the external device. The second outer electrode 14 is located on the other end side of the lateral direction and has a rectangular form. The second outer electrode 14 is connected to a voltage output terminal of the external device. The first outer electrode 12, ground outer electrode 13, and second outer electrode 14 are formed by applying an electrically conductive paste to the first principal surface $3a$ of the piezoelectric element 2 and sintering the paste at a predetermined temperature (e.g., about 700° C.). The sintered electrode layer obtained by sintering the electrically conductive paste may further be subjected to electroplating, so as to form a plating layer thereon. As the electrically conductive paste, one containing an electrically conductive material mainly composed of Ag may be used. An example of the plating layer is an Ni/Au plating layer.

The outer electrodes 12, 13, 14 may also be formed by sputtering, vapor deposition, or the like using a metal mask formed with respective openings at portions corresponding to the outer electrodes 12, 13, 14. Examples of the film structure constituting the outer electrodes 12, 13, 14 in this case include Cr/Ni, NiCu/Ag, SnAg, and Au.

As shown in FIG. 2, the second principal surface $3b$ of the multilayer portion 3 includes a first region 4A and a pair of second regions $4B_1$, $4B_2$ which project from the first region 4A. The second regions $4B_1$, $4B_2$ are positioned such as to project from the first region 4A in directions parallel to the laminating direction of the piezoelectric layers 10, 20, 30, 40, 50, 70.

Letting L be the longitudinal size of the multilayer portion 3, the second region $4B_1$ is disposed such as to extend widthwise of the multilayer portion 3 at a position separated by L/3 from one longitudinal end $3c$ of the multilayer portion 3. The second region $4B_2$ is disposed such as to extend widthwise of the multilayer portion 3 at a position separated by L/3 from the other longitudinal end $3d$ of the multilayer portion 3 (see FIG. 3). In this embodiment, the lateral length of each of the second regions $4B_1$, $4B_2$ is the same as the width of the multilayer portion 3.

The protective film 5 is constituted by a material harder than the multilayer portion 3, examples of which include DLC (Diamond-Like Carbon), TiN, SiC, and BP (Boron Phosphide). The protective film 5 covers the second principal surface $3b$ (the first region 4A and second regions $4B_1$, $4B_2$). The protective film 5 constitutes one outer surface of the piezoelectric element 2. The protective film 5 has a first region 5A covering the first region 4A and second regions $5B_1$, $5B_2$ covering the second regions $4B_1$, $4B_2$. The second regions $5B_1$, $5B_2$ project from the first region 5A in directions parallel to the laminating direction of the piezoelectric layers 10, 20, 30, 40, 50, 70.

In this embodiment, the second regions $5B_1$, $5B_2$ of the protective film 5 have flat surfaces $5B_{11}$, $5B_{21}$, respectively. The flat surfaces $5B_{11}$, $5B_{21}$ function as a frictional portion which comes into contact with a body to be driven DB and which generates a frictional force therewith. The body to be driven DB is moved by the frictional force. When the piezoelectric element 2 does not have the protective film 5, the second regions $4B_1$, $4B_2$ of the second principal surface $3b$ have flat surfaces to function as the frictional portion. The protective film 5 is not always required to cover the second principal surface $3b$ as a whole but may be formed such as to cover at least the second regions $4B_1$, $4B_2$. The thickness of the protective film 5 is on the order of 0.5 to 20 μm, for example.

When seen from the second principal surface (the upper face in FIG. 2) $3b$ side, each of the flat surfaces $5B_{11}$, $5B_{21}$ has an elliptical form having a greater diameter in the lateral direction of the piezoelectric element 2 than in the longitudinal direction thereof. That is, each of the flat surfaces $5B_{11}$, $5B_{21}$ has a diameter (length) $L_{p2}$ in the longitudinal direction of the piezoelectric element 2 shorter than a diameter (length) $L_{p1}$ in the lateral direction of the piezoelectric element 2. The longitudinal length (diameter) $L_{p2}$ at a lateral center region of each flat surface $5B_{11}$, $5B_{21}$ is longer than a longitudinal length $L_{p3}$ at a lateral end region thereof. The lateral center region is a center region of each flat surface $5B_{11}$, $5B_{21}$ in the lateral direction, and that the lateral end region is an end region thereof in the lateral direction. In this embodiment, the longitudinal length of each flat surface $5B_{11}$, $5B_{21}$ at the lateral center region thereof equals the length of each flat surface $5B_{11}$, $5B_{21}$ in the longitudinal direction of the piezoelectric element 2. When seen from the second principal surface 3b side, each of the flat surfaces $5B_{11}$, $5B_{21}$ may have a form (any of substantially rectangular and polygonal forms and their combinations) which has a longer length in the lateral direction of the piezoelectric element 2 than in the longitudinal direction thereof while a lateral end thereof has a side. In this case, each of the flat surfaces $5B_{11}$, $5B_{21}$ also has a longer longitudinal length at the lateral center region than at the lateral end region. In each of the flat surfaces $5B_{11}$, $5B_{21}$, the center region is a region including a line segment passing at least the center thereof and lying along the longitudinal direction thereof. The end region in each of the flat surfaces $5B_{11}$, $5B_{21}$ is a region including at least one lateral end thereof.

As shown in FIGS. 3 and 4, the multilayer portion 3 is constructed as a multilayer body in which rectangular sheet-like piezoelectric layers 10, 20, 30, 40, 50, 60, 70 having a piezoelectric characteristic (i.e., adapted to deform when voltage is applied), a relay electrode 21, a first inner electrode 31, a first ground electrode layer (ground electrode layer) 41, and a second inner electrode layer 51 are laminated. The relay electrode layer 21, first inner electrode layer 31, first ground electrode layer (ground electrode layer) 41, and second inner electrode layer 51 are arranged one by one along the laminating direction of the piezoelectric layers 10, 20, 30, 40, 50, 70 (i.e., thickness direction of the piezoelectric element 2) within the piezoelectric element 2.

The outer electrode layer 11 is formed on the piezoelectric layer 10 serving as the first principal surface 3a of the multilayer portion 3 as will be explained later. The relay electrode layer 21, first inner electrode layer 31, first ground electrode layer 41, and second inner electrode layer 51 are formed on the piezoelectric layers 20, 30, 40, and 50, respectively.

Each of the piezoelectric layers 10, 20, 30, 40, 50, 70 is made of a piezoelectric ceramic material mainly composed of PZT, for example. Each of the piezoelectric layers 10, 20, 30, 40, 50, 70 has a thickness on the order of 10 to 100 μm, for example. In the multilayer piezoelectric actuator 1 in practice, the plurality of piezoelectric layers 10, 20, 30, 40, 50, 70 are integrated to such an extent that their boundaries are indiscernible.

The relay electrode layer 21 is arranged widthwise of the piezoelectric layer 20 at the longitudinal center position thereof. The relay electrode layer 21 includes a first relay electrode 22, a ground relay electrode 23, and a second relay electrode 24 which are electrically insulated from each other on the piezoelectric layer 20. The first relay electrode 22 is located on one end side of the lateral direction and has a rectangular form. The ground relay electrode 23 is located at the center of the lateral direction and has a rectangular form whose longitudinal direction is oriented in the lateral direction. The second relay electrode 24 is located on the other end side of the lateral direction and has a rectangular form.

The first inner electrode layer 31 includes a first electrode 32, a ground relay electrode 33, and a second electrode 34 which are electrically insulated from each other on the piezoelectric layer 30. The ground relay electrode 33 is positioned such as to overlap the ground relay electrode 23 at the longitudinal center position as seen from the thickness direction and has a rectangular form.

The first electrode 32 has an electrode portion 32a and a relay electrode portion 32b. The electrode portion 32a is disposed closer to one end 3c (i.e., closer to one end 30c of the piezoelectric layer 30) than is the longitudinal center position of the piezoelectric element 2. The electrode portion 32a is positioned such as to cover the upper face of the piezoelectric layer 30 in substantially all of the area extending from the ground relay electrode 33 to one end 30c and has a rectangular form. A thickness formation region 101 is formed at a position corresponding to the second region $4B_1$ in the electrode portion 32a. When seen in the thickness direction of the piezoelectric element 2, the thickness formation region 101 has a rectangular parallelepiped form which is longer in the lateral direction of the piezoelectric element 2 than in the longitudinal direction thereof. The lateral length of the thickness formation region 101 may be equal to or shorter than the length of the electrode portion 32a in lateral direction of the piezoelectric element 2. The thickness formation region 101 is made of the same electrically conductive material as with the electrode portion 32a and has a height on the order of 0.5 to 10 μm, for example.

The relay electrode portion 32b is disposed at the longitudinal center. The relay electrode portion 32b is positioned such as to project from the electrode portion 32a to the longitudinal center position and overlap the first relay electrode 22 as seen from the thickness direction and has a rectangular form.

The second electrode 34 has an electrode portion 34a and a relay electrode portion 34b. The electrode portion 34a is disposed closer to the other end 3d (i.e., closer to the other end 30d of the piezoelectric layer 30) than is the longitudinal center position of the piezoelectric element 2. The electrode portion 34a is positioned such as to cover the upper face of the piezoelectric layer 30 in substantially all of the area extending from the ground relay electrode 33 to the other end 30d and has a rectangular form. A thickness formation region 102 having the same form and thickness as with the thickness formation region 101 is formed at a position corresponding to the second region $4B_2$ in the electrode portion 34a. The thickness formation region 102 is made of the same electrically conductive material as with the electrode portion 34a.

The relay electrode portion 34b is disposed at the longitudinal center. The relay electrode portion 34b is positioned such as to project from the electrode portion 34a to the longitudinal center position and overlap the second relay electrode 24 as seen from the thickness direction and has a rectangular form.

The first ground electrode layer 41 includes a first relay electrode 42, a ground electrode 43, and a second relay electrode 44 which are electrically insulated from each other on the piezoelectric layer 40. The ground electrode 43 is positioned such as to cover substantially the whole surface of the upper face of the piezoelectric layer 40 and has a substantially rectangular form. The ground electrode 43 is disposed such as to overlap all of the electrode portions 32a, 34a and ground relay electrodes 23, 33 as seen from the thickness direction. A thickness formation region 111 having the same form and thickness as with the thickness formation region 101 is formed at a position corresponding to the second region $4B_1$ in the ground electrode 43. Similarly, a thickness formation region 112 having the same form and thickness as with the thickness formation region 102 is formed at a position corresponding to the second region $4B_2$ in the ground electrode 43. The thickness formation regions 111, 112 are made of the same electrically conductive material as with the ground electrode 43.

At the longitudinal center position of the ground electrode 43, rectangular recesses are formed on both end sides of the lateral direction of the piezoelectric layer 40. The first and second relay electrodes 42, 44 are disposed at the recesses, respectively. The first relay electrode 42 is positioned such as to overlap the relay electrode portion 32b and the first relay electrode 22 as seen from the thickness direction. The second relay electrode 44 is positioned such as to overlap the relay electrode portion 34b and the second relay electrode 24 as seen from the thickness direction.

The second inner electrode layer 51 includes a third electrode 54, a ground relay electrode 53, and a fourth electrode 52 which are electrically insulated from each other on the piezoelectric layer 50. The ground relay electrode 53 is positioned such as to overlap the ground relay electrodes 23, 33 at the longitudinal center position as seen from the thickness direction and has a rectangular form.

The third electrode 54 has an electrode portion 54a and a relay electrode portion 54b. The electrode portion 54a is disposed closer to one end 3c (i.e., closer to one end 50c of the piezoelectric layer 50) than is the longitudinal center position of the piezoelectric element 2. A thickness formation region 121 having the same form and thickness as with the thickness formation region 101 is formed at a position corresponding to the second region $4B_1$ in the electrode portion 54a. The thickness formation region 121 is made of the same electrically conductive material as with the electrode portion 54a.

The relay electrode portion 54b is disposed at the longitudinal center. The electrode portion 54a is positioned such as to cover the upper face of the piezoelectric layer 50 in substantially all of the area extending from the ground relay electrode 53 to one end 50c and has a rectangular form. As a consequence, the electrode portion 54a overlaps the electrode portion 32a and a portion of the ground electrode 43 as seen from the thickness direction. The relay electrode portion 54b has a rectangular form such as to project from the electrode portion 54a to the longitudinal center position and overlap the second relay electrodes 24, 44 and the relay electrode portion 34b as seen from the thickness direction.

The fourth electrode 52 includes an electrode portion 52a and a relay electrode portion 52b. The electrode portion 52a is disposed closer to the other end 3d (i.e., closer to the other end 50d of the piezoelectric layer 50) than is the longitudinal center position of the piezoelectric element 2. A thickness formation region 122 having the same form and thickness as with the thickness formation region 101 is formed at a position corresponding to the second region $4B_1$ in the electrode portion 52a. The thickness formation region 122 is made of the same electrically conductive material as with the electrode portion 52a.

The relay electrode portion 52b is disposed at the longitudinal center. The electrode portion 52a is positioned such as to cover the upper face of the piezoelectric layer 50 in substantially all of the area extending from the ground relay electrode 53 to the other end 50d and has a rectangular form. As a consequence, the electrode portion 52a overlaps the electrode portion 34a and a portion of the ground electrode 43 as seen from the thickness direction. The relay electrode portion 52b is positioned such as to project from the electrode portion 52a to the longitudinal center position and overlap the first relay electrodes 22, 42 and the relay electrode portion 32b thereabove as seen from the thickness direction and has a rectangular form.

Through-holes penetrating through the piezoelectric layers 10, 20, 30, 40 in their thickness direction are formed at their positions corresponding to the first relay electrodes 22, 42 and relay electrode portions 32b, 52b. A first through-hole conductor 6 is disposed in these through-holes. The first through-hole conductor 6 electrically connects the first outer electrode 12, first relay electrode 22, first electrode 32, first relay electrode 42, and fourth electrode 52 together.

Through-holes penetrating through the piezoelectric layers 10, 20, 30, 40 in their thickness direction are formed at their positions corresponding to the ground relay electrodes 23, 33, 53 and the longitudinal center region of the ground electrode 43. A ground through-hole conductor 7 is disposed in these through-holes. The ground through-hole conductor 7 electrically connects the ground outer electrode 13, ground relay electrodes 23, 33, ground electrode 43, and ground relay electrode 53 together.

Through-holes penetrating through the piezoelectric layers 10, 20, 30, 40 in their thickness direction are formed at their positions corresponding to the second relay electrodes 24, 44 and relay electrode portions 34b, 54b. A second through-hole conductor 8 is disposed in these through-holes. The second through-hole conductor 8 electrically connects the second outer electrode 14, second relay electrode 24, second electrode 34, second relay electrode 44, and third electrode 54 together.

The first through-hole conductor 6, ground through-hole conductor 7, and second through-hole conductor 8 are located at the longitudinal center position of the piezoelectric element 2 and are arranged in a row along the lateral direction of the piezoelectric element 2. The through-hole conductors 6, 7, 8 contain an electrically conductive material. The electrically conductive material contained in the through-hole conductors 6, 7, 8 may be at least one kind of metals selected from the group consisting of Pd, Ag, Cu, W, Mo, Sn, and Ni or an alloy containing at least one kind of these metals Each of the through-hole conductors 6, 7, 8 has a diameter on the order of 20 to 100 μm, for example. The piezoelectric element 2 constituted by the electrode layers 11, 21, 31, 41, 51 and piezoelectric layers 10, 20, 30, 40, 50, 70 includes thickness adjustment layers LY1, LY2 and a driving layer LY3 for vibrating the piezoelectric element 2. The driving layer LY3 includes an active portion, while each of the thickness adjustment layers LY1, LY2 includes an inactive portion.

The driving layer LY3 is constituted by the first inner electrode layer 31, piezoelectric layer 30, first ground electrode layer 41, piezoelectric layer 40, and second inner electrode layer 51. The thickness adjustment layer LY1 is constituted by the piezoelectric layer 10, relay electrode layer 21, and piezoelectric layer 20. The thickness adjustment layer LY2 is constituted by the piezoelectric layers 50, 70. In the driving layer LY3, a region which overlaps the first inner electrode layer 31, first ground electrode layer 41, and second inner electrode layer 51 and is adapted to be displaced in response to a voltage applied thereto is an active portion. That is, as illustrated in FIG. 4, the length of the active portion in the lateral direction of the piezoelectric element 2 is equal to the length $L_{a1}$ of the first inner electrode layer 31, first ground electrode layer 41, and second inner electrode layer 51 in the lateral direction of the piezoelectric element 2. In the driving layer LY3, a region which overlaps none of the first inner electrode layer 31, first ground electrode layer 41, and second inner electrode layer 51 and is not displaced in response to a voltage applied thereto is an inactive portion. At the time of manufacturing the piezoelectric element 2, the thickness adjustment layers LY1, LY2 are polished so as to adjust their thickness, thereby regulating the vibration frequency in the piezoelectric element 2. The thickness adjustment layers LY1, LY2 are set to substantially the same thickness, whereby the piezoelectric element 2 has a structure symmetrical about the thickness direction.

In the driving layer LY3, the piezoelectric layer 30 located between the first inner electrode layer 31 and the first ground electrode layer 41 and the piezoelectric layer 40 located between the first ground electrode layer 41 and the second inner electrode layer 51 have been polarized. The polarization is effected from the first inner electrode layer 31 to the first ground electrode layer 41 and from the second inner electrode layer 51 to the first ground electrode layer 41.

In the multilayer portion 3, the second regions $4B_1$, $4B_2$ project from the first region 4A by an amount corresponding to the thicknesses of the thickness formation regions 101, 102, 111, 112, 121, 122. Therefore, the height by which the second regions $4B_1$, $4B_2$ project can be adjusted by the number and height of the thickness formation regions.

Figure 5A:
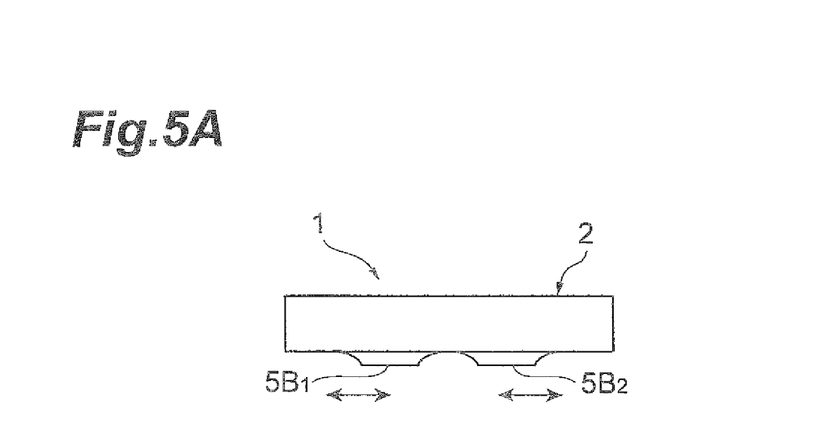
FIGS. 5A and 5B are diagrams each illustrating a vibration mode of the multilayer piezoelectric actuator in accordance with the embodiment.
Figure 5B:
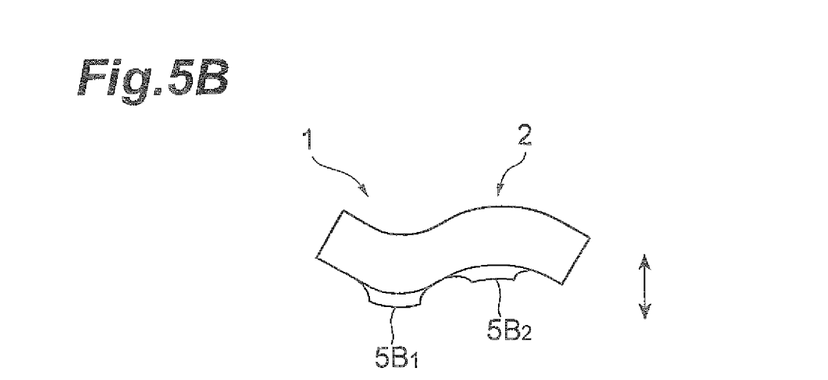
Figure 6A:
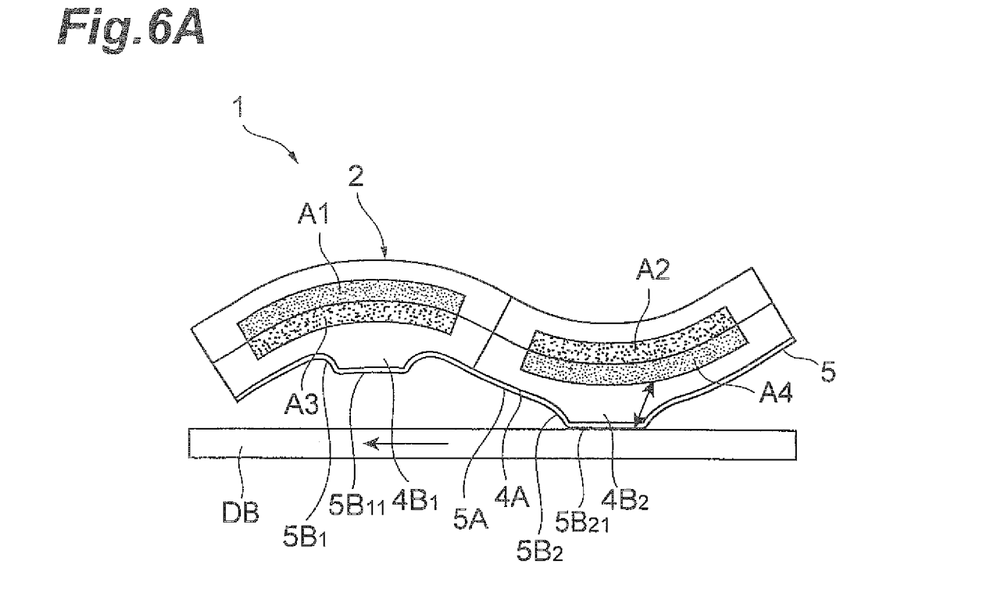
FIGS. 6A and 6B are diagrams each illustrating how the multilayer piezoelectric actuator in accordance with the embodiment drives a rotor.
Figure 6B:
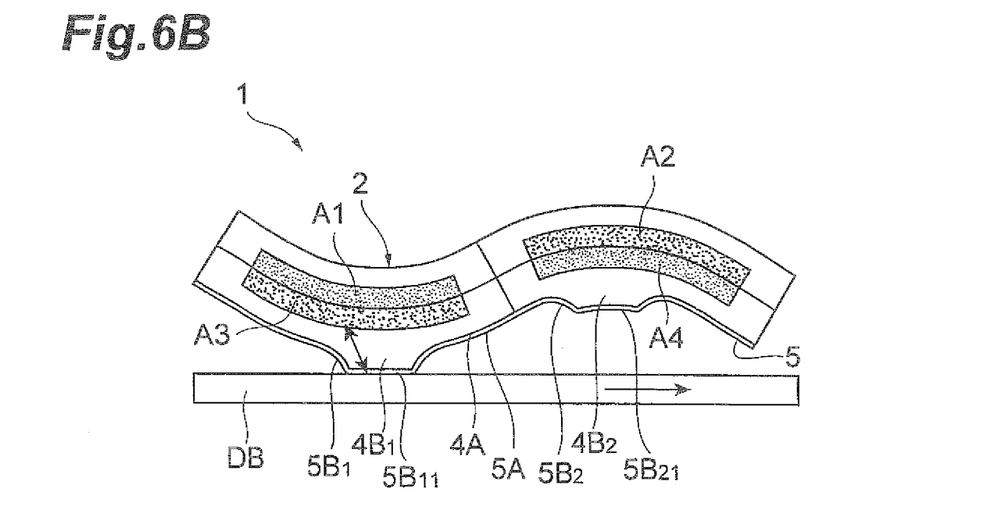

Operations of the multilayer piezoelectric actuator 1 will now be explained with reference to FIGS. 5A, 5B, 6A and 6B. FIGS. 5A and 5B are views each showing vibration modes of the multilayer piezoelectric actuator 1. FIGS. 6A and 6B are views each showing how the multilayer piezoelectric actuator 1 drives the body to be driven DB.

The multilayer piezoelectric actuator 1 has two resonance modes at the time of driving. Specifically, the multilayer piezoelectric actuator 1 vibrates according to a longitudinal vibration mode of vibrating longitudinally of the piezoelectric element 2 as shown in FIG. 5A and a bending vibration mode in the thickness direction of the piezoelectric element 2 as shown in FIG. 5B which are superposed on each other. The respective resonance frequencies in the longitudinal and bending vibration modes have been fitted to each other by polishing the thickness adjustment layers LY1, LY2 of the piezoelectric element 2 (see FIG. 3).

FIGS. 6A and 6B illustrate states in which the longitudinal and bending vibration modes are superposed on each other. An active portion A1 constructed by the first electrode 32, ground electrode 43, and dielectric layer 30 and an active portion A4 constructed by the fourth electrode 52, ground electrode 43, and piezoelectric layer 40 are driven. In this case, as illustrated in FIG. 6A, the flat surface $5B_{21}$ in the second region $5B_2$ of the protective film 5 comes into contact with the body to be driven DB, thereby generating a frictional force between the flat surface $5B_{21}$ in the second region $5B_2$ and the body to be driven DB. The frictional force generated between the flat surface $5B_{21}$ in the second region $5B_2$ and the body to be driven DB lets the body to be driven DB move in the arrowed direction in FIG. 6A. Since the displacement caused by the voltage application is the largest at the centers of the active portions A1, A4, the second region $5B_2$ may overlap the centers of the active portions A1, A4 as seen from the thickness direction of the piezoelectric element 2.

An active portion A2 constructed by the second electrode 34, ground electrode 43, and piezoelectric layer 30 and an active portion A3 constructed by the third electrode 54, ground electrode 43, and piezoelectric layer 40 are driven. In this case, as illustrated in FIG. 6B, the flat surface $5B_{11}$ in the second region $5B_1$ of the protective film 5 comes into contact with the body to be driven DB, thereby generating a frictional force between the flat surface $5B_{11}$ in the second region $5B_1$ and the body to be driven DB. The frictional force generated between the flat surface $5B_{11}$ in the second region $5B_1$ and the body to be driven DB lets the body to be driven DB move in the arrowed direction in FIG. 6B. Since the displacement caused by the voltage application is the largest at the centers of the active portions A2, A3, the second region $5B_1$ may overlap the centers of the active portions A2, A3 as seen from the thickness direction of the piezoelectric element 2.

When the piezoelectric element 2 is driven by applying voltages whose phases shift from each other by 90° to the first and second outer electrodes 12, 14, respectively, elliptic motions whose phases shift from each other by 180° occur in the frictional portions (flat surfaces $5B_{11}$, $5B_{21}$), respectively. As a consequence, the frictional forces alternately act on the body to be driven DB, whereby the body to be driven DB moves.

Referring to FIGS. 3 and 6, the above-mentioned vibrations have nodes (where no amplitudes occur in the vibrations) at the longitudinal center position of the piezoelectric element 2, a position separated from one end $3c$ by L/6, and a position separated from the other end $3d$ by L/6, respectively. One end $3c$, the other end $3d$, a position separated from one end $3c$ by L/3 (i.e., the position where the second region $5B_1$ is disposed), and a position separated from the other end $3d$ by L/3 (i.e., the position where the second region $5B_2$ is disposed) are positions where the maximum amplitude occurs.

Figure 7:
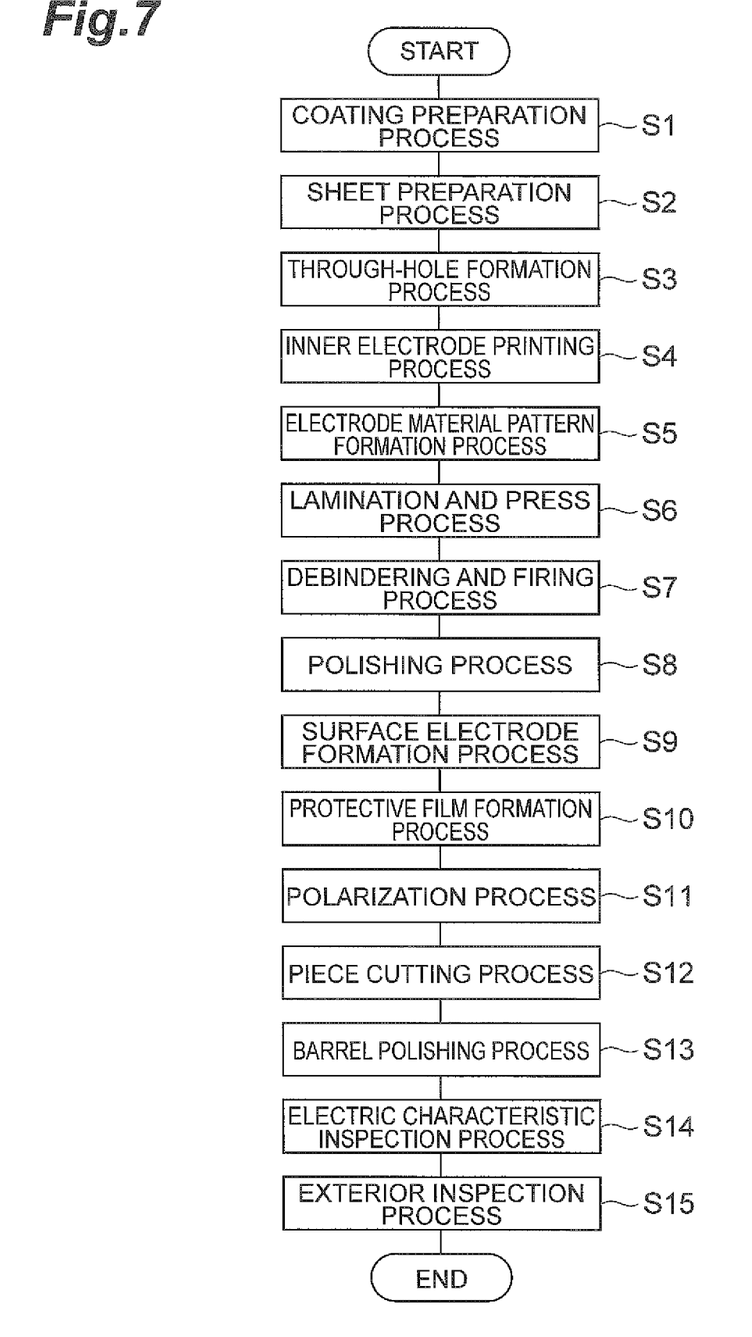
FIG. 7 is a flowchart illustrating a method of manufacturing the multilayer piezoelectric actuator in accordance with the embodiment.

A method of manufacturing the multilayer piezoelectric actuator 1 in accordance with this embodiment will now be explained with reference to FIG. 7. FIG. 7 is a flowchart showing the method of manufacturing the multilayer piezoelectric actuator 1 in accordance with this embodiment.

As shown in FIG. 7, the process for manufacturing the multilayer piezoelectric actuator 1 begins with a coating preparation process S1. The coating preparation process S1 mixes a piezoelectric material for making the piezoelectric layers 10 to 70, an organic solvent, and an organic binder together, so as to turn them into a coating material. Subsequently, a sheet preparation process S2 is carried out. The sheet preparation process S2 applies the coating material obtained by the coating preparation process S1 to PET film 201, so as to form piezoelectric sheets each having a thickness corresponding to that of each piezoelectric layer.

After the sheet preparation process S2, a through-hole formation process S3 is carried out. The through-hole formation process S3 forms the piezoelectric sheets with through-holes at predetermined positions corresponding to positions where the through-hole conductors 6, 7, 8 are arranged. After forming the piezoelectric sheets with the through-holes, an inner electrode printing process S4 and an electrode material pattern formation process S5 are carried out. The inner electrode printing process S4 may be carried out after the electrode material pattern formation process S5.

Using an electrically conductive paste, the inner electrode printing process S4 forms the upper faces of uncut piezoelectric layers 10 to 70 with their corresponding electrode patterns and through-hole conductor patterns by screen printing or the like. Here, the piezoelectric layers 10 to 70 are formed with patterns corresponding to the outer electrode layer 11, relay electrode layer 21, first inner electrode layer 31, first ground electrode layer 41, second inner electrode layer 51, and through-hole conductors 6, 7, 8.

The electrode material pattern formation process S5 provides desirable positions of at least the first inner electrode layer 31, first ground electrode layer 41, and second inner electrode layer 51 with conductive pastes made of the same materials as with their corresponding electrode layers by screen printing and the like. The conductive pastes become the thickness formation regions 101, 102, 111, 112, 121, 122, respectively. Each of the thickness formation regions 101 to 122 is formed into a rectangular parallelepiped. For example, the thickness formation regions 101 to 122 have lengths on the order of 0.5 to 5 mm and 0.5 to 10 mm in the longitudinal and lateral directions, respectively. The thickness formation regions 101 to 122 have a thickness on the order of 0.5 to 10 μm, for example, which can be adjusted by the number of repeating screen printing process and the like, for example.

Figure 8:
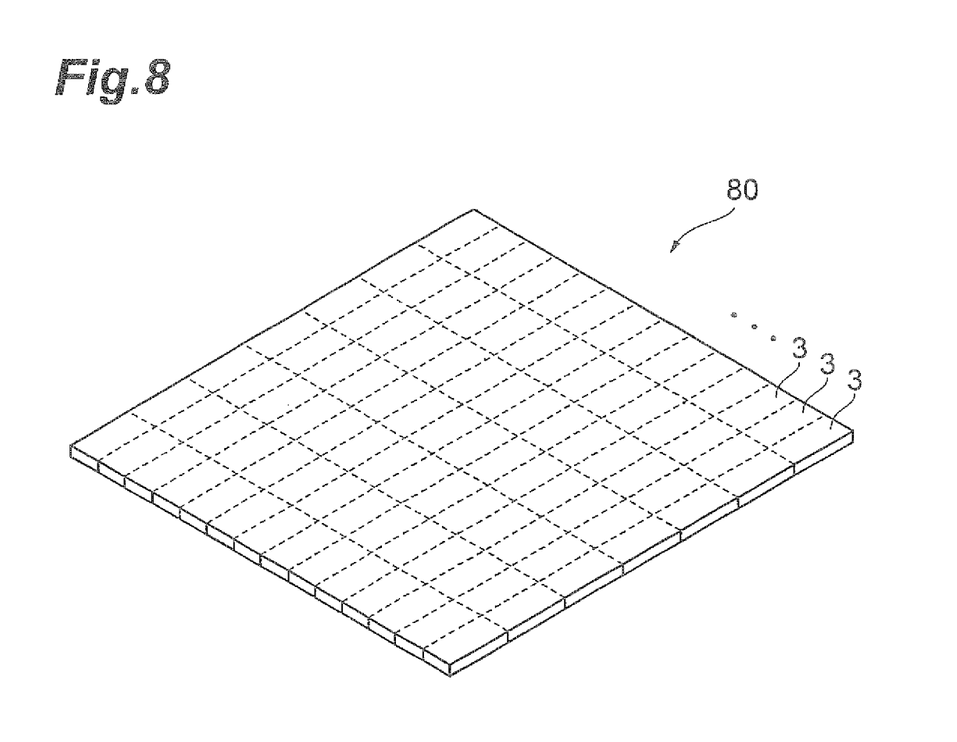
FIG. 8 is a perspective view illustrating a multilayer body obtained by a lamination and press process.
Figure 9:
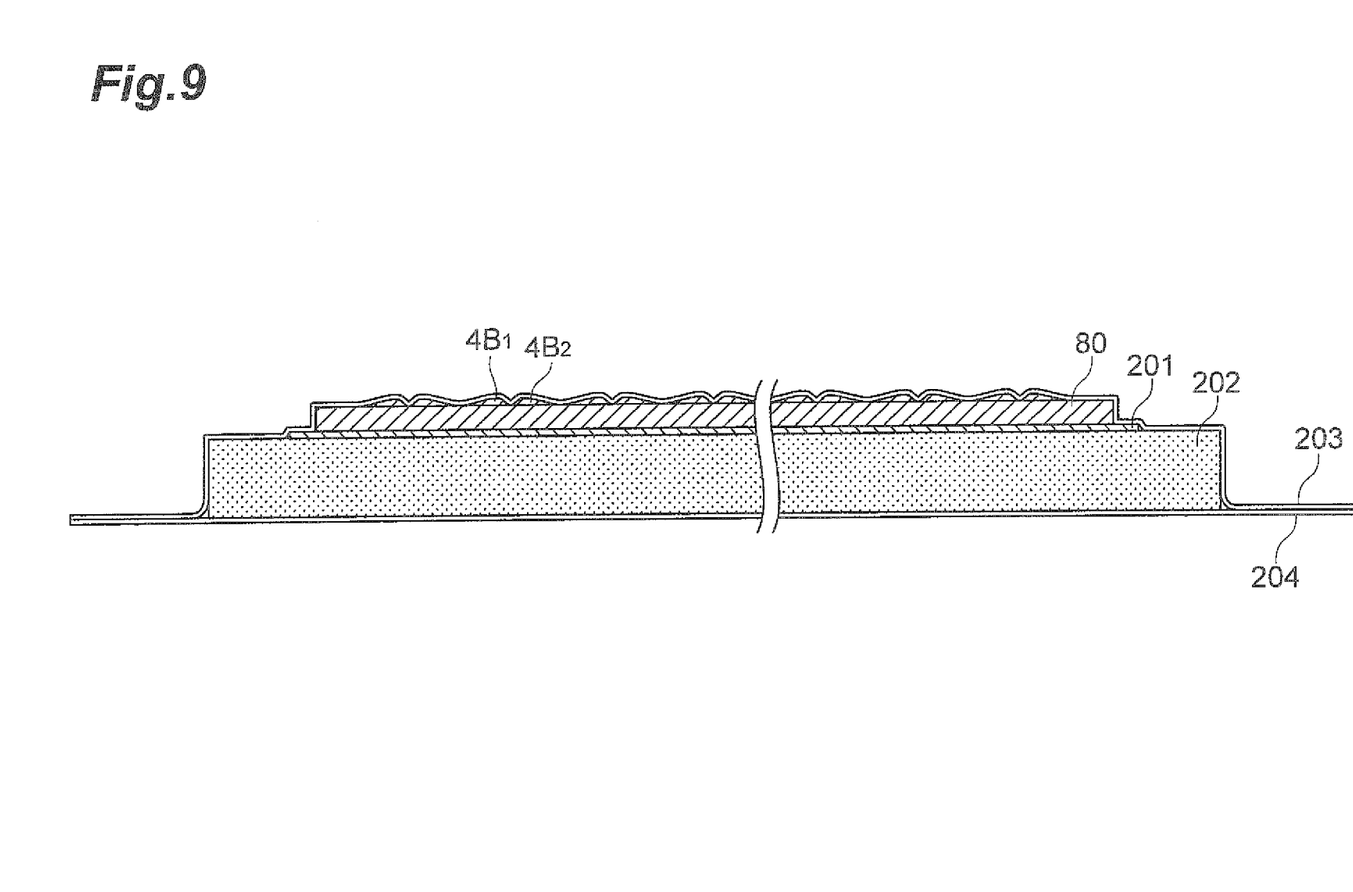
FIG. 9 is a side view of the multilayer body subjected to the press process.

A lamination and press process S6 laminates the uncut piezoelectric layers 10, 20, 30, 40, 50, 70 in this order, so as to yield a multilayer body 80 as illustrated in FIG. 8. The multilayer body 80 is pressed by isostatic pressing. As illustrated in FIG. 9, the multilayer body 80 disposed on a PET film 201 is placed on a substrate 202. The multilayer body 80, PET film 201, and substrate 202 are vacuum-sealed with vacuum packaging films 203, 204. The vacuum-sealed multilayer body 80 is sunk into water reserved in a tank, for example, so as to be isostatically pressed. The isostatic pressing causes the outer surface of the multilayer body 80 not in contact with the PET film 201 to project. This forms the second regions $4B_1$, $4B_2$ as illustrated in FIG. 9. The substrate 202 prevents the outer surface of the multilayer body 80 in contact with the PET film 201 from projecting. This forms the second regions $4B_1$, $4B_2$ on one outer surface of the piezoelectric element 2 with favorable selectivity. The pressure applied to the multilayer body 80 by the isostatic pressing is about 1000 kgf/cm² (about 100 MPa), for example. The temperature of water is about 60° C., for example. After the isostatic pressing, a debindering and firing process S7 is carried out. The substrate 202 is made of stainless steel, for example.

The piezoelectric material paste is applied by the dispenser or screen printing with a positional precision much higher than a machining precision with which the multilayer body 80 is formed with a concave portion. This improves the positional precision for forming the second regions $4B_1$, $4B_2$ and thus can prevent the second regions $4B_1$, $4B_2$ from shifting their positions. When the piezoelectric material paste is applied by the dispenser or screen printing, the height of piezoelectric material patterns can be kept low as mentioned above, whereby the multilayer piezoelectric actuator 1 can attain a lower profile. The application by the dispenser or screen printing is a known process, which can easily form the second regions $4B_1$, $4B_2$ at a very low cost.

Next, the debindering and firing process S7 is carried out. Here, under a predetermined heat treatment condition, the multilayer body 80 is debindered and then fired. This forms the fired multilayer body 80 with the second regions $4B_1$, $4B_2$ overlapping regions corresponding to active portions. For example, each of the second regions $4B_1$, $4B_2$ has a height on the order of 5 to 30 μm and a width on the order of 0.5 to 2 mm.

After firing the multilayer body 80, a polishing process S8 is carried out. The polishing process S8 polishes the thickness adjustment layers LY1, LY2, so as to fit the respective resonance frequencies of the longitudinal and bending vibration modes to each other. Specifically, the piezoelectric layer 10 or 70 is polished. After the polishing process S8, the second regions $4B_1$, $4B_2$ are partly flattened, so as to be formed with respective flat surfaces.

Subsequently, a surface electrode formation process S9 is carried out. Here, using the electrically conductive paste, electrode patterns corresponding to the first outer electrode 12, ground outer electrode 13, and second outer electrode 14 for electrically connecting the through-hole conductors 6, 7, 8 exposed at the upper face of the piezoelectric layer 10 to external circuits are formed on the upper face of the piezoelectric layer 10 by screen printing or the like. Thereafter, the electrode patterns are sintered under a predetermined heat treatment condition. This forms the first outer electrode 12, ground outer electrode 13, and second outer electrode 14. The outer electrodes 12, 13, 14 may be formed by sputtering, vapor deposition, or the like through a metal mask as mentioned above.

Next, a protective film formation process S10 is carried out. The protective film formation process S10 forms the protective film 5 so as to cover the whole outer surface of the multilayer body 80 formed with the second regions $4B_1$, $4B_2$. For forming the protective film 5, plasma CVD or the like can be used. After the protective film formation process S10, the second regions $5B_1$, $5B_2$ having the flat surfaces $5B_{11}$, $5B_{21}$, respectively, are formed.

When seen in the thickness direction of the multilayer body 80, each of the flat surfaces $5B_{11}$, $5B_{21}$ has an elliptical form in which the diameter $L_{p2}$ in the longitudinal direction of the piezoelectric element 2 is shorter than the diameter $L_{p1}$ in the lateral direction thereof. In end regions of the flat surfaces $5B_{11}$, $5B_{21}$ in the lateral direction, portions overlapping none of the first inner electrode layer 31, first ground electrode layer 41, and second inner electrode layer 51 may be formed. Such a portion overlaps an inactive portion and acts so as to inhibit the second regions $5B_1$, $5B_2$ from being displaced. Forming the flat surfaces $5B_{11}$, $5B_{21}$ elliptic as mentioned above reduces the end regions in the flat surfaces $5B_{11}$, $5B_{21}$. The length $L_{p1}$ of each of the $5B_{11}$, $5B_{21}$ in the lateral direction of the piezoelectric element 2 is equal to or shorter than the length $L_{a1}$ of the active portion in the lateral direction of the piezoelectric element 2. Instead of the above-mentioned elliptical form, each of the flat surface $5B_{11}$, $5B_{21}$ may have a form (any of substantially rectangular and polygonal forms and their combinations) which has a longer length in the lateral direction of the piezoelectric element 2 than in the longitudinal direction thereof while a lateral end thereof has a side. In this case, each of the flat surfaces $5B_{11}$, $5B_{21}$ also has a longer longitudinal length at the lateral center region than at the lateral end region. That is, the end regions are smaller in this embodiment than in a case where the longitudinal length at the lateral center region is equal to that at the lateral end region. The lateral length of each of the flat surfaces $5B_{11}$, $5B_{21}$ may be equal to or shorter than that of the above-mentioned electrodes.

Next, a polarization process S11 is carried out. The polarization process S11 performs polarization by a known technique in order for piezoelectric materials to attain fixed polarities. Thereafter, a piece cutting process S12 for cutting the multilayer body 80 into piezoelectric elements 2 is carried out. The multilayer body 80 is cut along dotted lines shown in FIG. 8. The individually cut piezoelectric elements 2 are put into a barrel polishing machine, so as to perform a barrel polishing process S13. Finally, an electric characteristic inspection process S14 for inspecting electric characteristics and an exterior inspection process S15 are carried out, whereby the manufacturing process shown in FIG. 7 ends.

Operations and effects of thus constructed multilayer piezoelectric actuator 1 will now be explained.

As mentioned above, the multilayer piezoelectric actuator 1 comprises a rectangular parallelepiped element body, formed by laminating a plurality of piezoelectric layers, having first and second principal surfaces; a first inner electrode layer, arranged within the element body so as to oppose the first and second principal surfaces, having a first electrode including an electrode portion arranged closer to one end than is a center position in a longitudinal direction of the element body and a second electrode, electrically insulated from the first electrode, including an electrode portion arranged closer to the other end than is the center position; a ground electrode layer having a ground electrode arranged within the element body so as to oppose the electrode portions of the first and second electrodes of the first inner electrode layer through the piezoelectric layer on the second principal surface side; a second inner electrode layer, arranged within the element body so as to oppose the ground electrode layer through the piezoelectric layer, having a third electrode including an electrode portion arranged closer to one end than is the center position and a fourth electrode, electrically insulated from the third electrode, including an electrode portion arranged closer to the other end than is the center position; an outer electrode layer, formed on the first principal surface, having a first outer electrode, a second outer electrode, and a ground outer electrode which are electrically insulated from each other; a first through-hole conductor extending in a thickness direction which is a laminating direction of the piezoelectric layers within the element body so as to electrically connect the first outer electrode, first electrode, and fourth electrode to each other; a second through-hole conductor extending in the thickness direction within the element body so as to electrically connect the second outer electrode, second electrode, and third electrode to each other; and a ground through-hole conductor extending in the thickness direction within the element body so as to electrically connect the ground outer electrode and ground electrode to each other; the first through-hole conductor, second through-hole conductor, and ground through-hole conductor are placed at the center position and arranged in a row along the lateral direction of the element body; and the piezoelectric actuator 1 generates a longitudinal vibration in its longitudinal direction and a bending vibration in its thickness direction.

In the multilayer piezoelectric actuator 1 in accordance with this embodiment, the first through-hole conductor 6 for electrically connecting the first outer electrode 12, first electrode 32, and fourth electrode 52 to each other within the piezoelectric element 2, the second through-hole conductor 8 for electrically connecting the second outer electrode 14, second electrode 34, and third electrode 54 to each other within the piezoelectric element 2, and the ground through-hole conductor 7 for electrically connecting the ground outer electrode 13 and ground electrode 43 to each other within the piezoelectric element 2 are placed at the longitudinal center position of the piezoelectric element 2 and arranged in a row in the lateral direction of the piezoelectric element 2. Electric connections among electrodes are achieved by the through-hole conductors 6, 7, 8 formed within the piezoelectric element 2. Therefore, the piezoelectric actuator 1 can be designed without taking account of contact with other components, and its components can be made smaller than in the case where side electrodes are provided as in conventional multilayer piezoelectric actuators.

The through-hole conductors 6, 7, 8 for connecting the electrodes to each other are disposed within the piezoelectric element 2 and thus can be prevented from being affected by their surrounding environments. This can improve the reliability. When there is a side electrode, a process of forming the side electrode for each piezoelectric element is necessary after forming the multilayer body 80 and cutting it into piezoelectric elements during the manufacture. Providing the through-hole conductors 6, 7, 8 within the piezoelectric element 2 can eliminate the side electrode formation process after cutting the multilayer body 80.

Through the ground electrode 43, the first and fourth electrodes 32, 52 diagonally positioned with respect to the longitudinal center position of the piezoelectric element 2 are electrically connected to each other, while the second and third electrodes 34, 54 positioned similarly are electrically connected to each other. Therefore, the multilayer piezoelectric actuator 1 causes a longitudinal vibration in the longitudinal direction and a bending vibration in the thickness direction with their node located at the center position of the piezoelectric element 2 (where the center line CL is located). Since the through-hole conductors 6, 7, 8 are formed at the center position serving as a node, the multilayer piezoelectric actuator 1 can alleviate stresses acting on the through-hole conductors 6, 7, 8. This can improve the reliability.

Figure 10A:
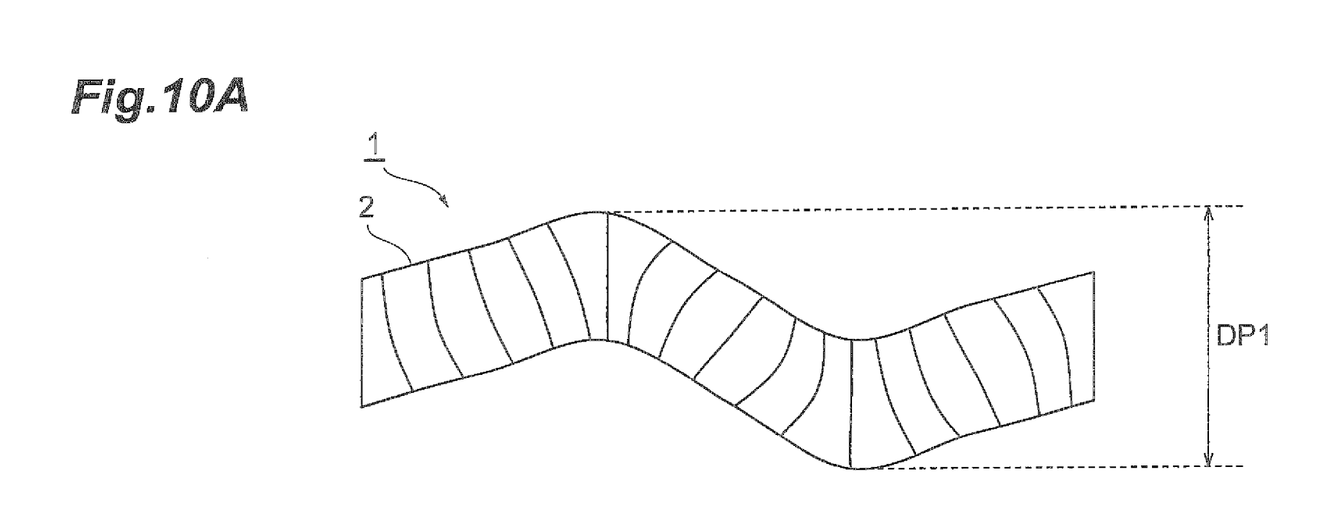
FIG. 10A is a diagram illustrating a magnitude of displacement in the multilayer piezoelectric actuator in accordance with the embodiment at the time of driving.
Figure 10B:
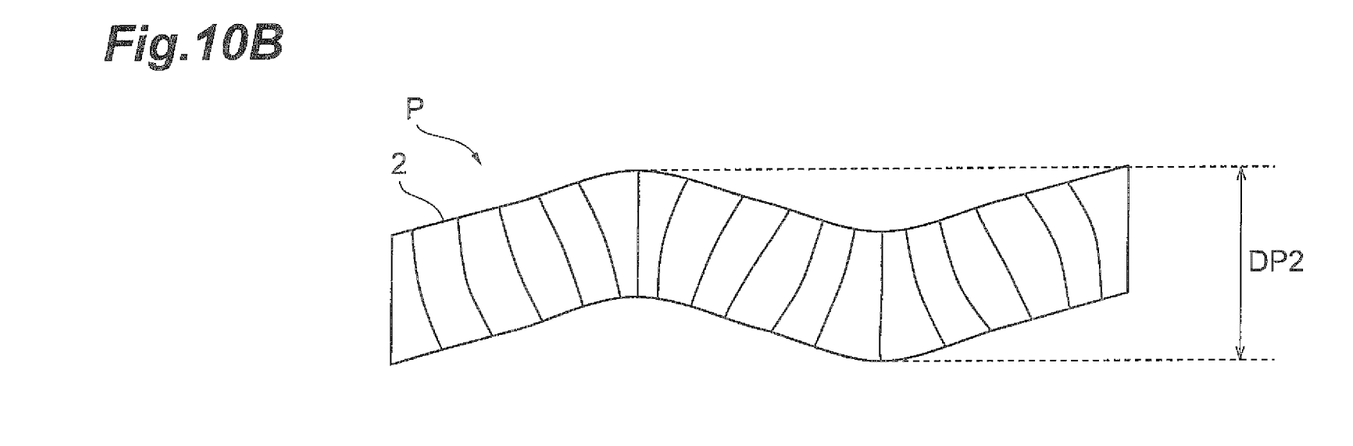
FIG. 10B is a diagram illustrating a magnitude of displacement in a conventional multilayer piezoelectric actuator at the time of driving.

Surroundings of a piezoelectric element portion where a through-hole conductor is disposed become softer in structure. Therefore, providing a plurality of through-hole conductors 6, 7, 8 at the longitudinal center position of the piezoelectric element 2 makes the structure of the piezoelectric element 2 softer in the vicinity of its center position, whereby the piezoelectric element 2 becomes easier to deform. Specifically, as shown in FIGS. 10A and 10B, the displacement (indicated by displacement DP1 in FIG. 10A) of the multilayer piezoelectric actuator 1 in accordance with this embodiment is greater than the displacement (indicated by displacement DP2 in FIG. 10B) of a conventional multilayer piezoelectric actuator P in which no through-hole conductors are formed at the longitudinal center position. This can increase the displacement at the time of driving without enhancing internal stresses acting on the piezoelectric element 2, thereby improving performances. The foregoing can improve the reliability and performances of the multilayer piezoelectric actuator 1 while making it smaller.

In the multilayer piezoelectric actuator 1, one outer surface of the piezoelectric element 2 includes the second regions $5B_1$, $5B_2$ projecting from the first region 5A, while the second regions $5B_1$, $5B_2$ have the flat surfaces $5B_{11}$, $5B_{21}$ configured to come into contact with the body to be driven DB and to generate a frictional force therewith. Therefore, the flat surfaces $5B_{11}$, $5B_{21}$ functioning as a frictional portion are not required to be constructed as members separate from the piezoelectric element 2, and it is not necessary for the piezoelectric element 2 (inactive portion) to be formed with depressions for securing the separate members. Hence, forming the flat surfaces $5B_{11}$, $5B_{21}$ does not affect the design and dimensions of the inactive portion and thus can prevent the size of the piezoelectric element 2 from being restricted. This eliminates variations in the position of the frictional portion caused by the forming of depressions and restrains resonance frequencies from varying in resonance modes (first and second vibration modes). As a result, the state of driving the multilayer piezoelectric actuator 1 can be kept from varying.

Since the flat surfaces $5B_{11}$, $5B_{21}$ functioning as a frictional portion are not constructed by separate members in the multilayer piezoelectric actuator 1, problems such as peeling of separate members from the piezoelectric element 2 do not occur.

In the multilayer piezoelectric actuator 1, each of the flat surfaces $5B_{11}$, $5B_{21}$ in the second regions $5B_1$, $5B_2$ has the length $L_{p2}$ in the longitudinal direction of the piezoelectric element 2 shorter than the length $L_{p1}$ in the lateral direction thereof, while the longitudinal length $L_{p2}$ at the lateral center region is longer than the longitudinal length $L_o$ at the lateral end region. The second regions $5B_1$, $5B_2$ are located such as to overlap the active portions corresponding to the active portions in the second principal surface 3b. The second regions $5B_1$, $5B_2$ include a region generating a relatively large displacement in response to a voltage applied thereto, the region being as a broad area. As a consequence, in the multilayer piezoelectric actuator 1, the piezoelectric element 2 and the body to be driven come into contact with each other by a broad area and generate a large frictional force. The lateral end regions of the flat surfaces $5B_{11}$, $5B_{21}$ are located in inactive portions in the lateral direction of the piezoelectric element 2 or laterally nearer to the inactive portions than are the center regions of the flat surfaces $5B_{11}$, $5B_{21}$. The inactive portions are not displaced by the voltage applied thereto and thus function to inhibit the second regions $5B_1$, $5B_2$ from being displaced. Since each of the flat surfaces $5B_{11}$, $5B_{21}$ has the longitudinal length $L_{p3}$ at the lateral end region shorter than the longitudinal length $L_{p2}$ at the lateral center region, the region inhibiting the piezoelectric element 2 from being displaced has a relatively small area. Therefore, the second regions $5B_1$, $5B_2$ having the flat surfaces $5B_{11}$, $5B_{21}$ improve the driving force of the multilayer piezoelectric actuator 1.

The length $L_{p1}$ of each of the flat surfaces $5B_{11}$, $5B_{21}$ in the lateral direction of the piezoelectric element 2 is equal to or shorter than the length $L_{a1}$ of the active portion in the lateral direction of the piezoelectric element 2. As a consequence, the flat surfaces $5B_{11}$, $5B_{21}$ are located inside of the active portions as seen from the thickness direction of the piezoelectric element 2. This can restrain the lateral end regions of the flat surfaces $5B_{11}$, $5B_{21}$ from inhibiting the piezoelectric element 2 from being displaced.

In the multilayer piezoelectric actuator 1, each of the second regions $5B_1$, $5B_2$ of the piezoelectric element 2 may overlap the center of its corresponding active portion as seen from a direction orthogonal to one outer surface (the thickness direction of the piezoelectric element 2). The center of the active portion is a position yielding the largest displacement when a voltage is applied thereto. When each of the second regions $5B_1$, $5B_2$ overlaps the center of its corresponding active portion, they are displaced more in response to the voltage applied thereto.

Though a preferred embodiment of the present invention is explained in the foregoing, the present invention is not necessarily restricted to the above-mentioned embodiment and can be modified in various manners within a scope not deviating from the gist thereof.

Though the electrode layer (outer electrode layer 11) located on the outer surface of the piezoelectric element 2 and the electrode layers (relay electrode layer 21, first inner electrode layer 31, first ground electrode layer 41, and second inner electrode layer 51) located within the piezoelectric element 2 are electrically connected to each other by the through-hole conductors 6, 7, 8 positioned within the piezoelectric element 2, this is not restrictive. For example, an electrode included in an electrode layer located within the piezoelectric element 2 may be drawn so as to be exposed at the outer surface of the piezoelectric element 2, and the electrode portion thus drawn to be exposed at the outer surface of the piezoelectric element 2 and the electrode layer located on the outer surface of the piezoelectric element 2 may be electrically connected to each other through a conductor disposed on the outer surface of the piezoelectric element 2. Meanwhile, the protective film 5 is formed on the outer surface of the piezoelectric element 2 in this embodiment. When the protective film 5 contains an electrically conductive material, it will be preferred if a structure achieving electric connections by the through-hole conductors 6, 7, 8 is employed in order to prevent short circuits from occurring as well.

From the invention thus described, it will be obvious that the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A piezoelectric actuator comprising a substantially rectangular parallelepiped piezoelectric element configured to generate first and second vibration modes simultaneously with each other in response to a voltage applied thereto,
   wherein the piezoelectric element has an active portion located between a plurality of inner electrodes arranged in the piezoelectric element and configured to be displaced in response to a voltage applied thereto,
   wherein one outer surface of the piezoelectric element includes a first region, and a second region located such as to project from the first region and to overlap a region corresponding to the active portion in the one outer surface,
   wherein the second region has a flat surface configured to come into contact with a body to be driven and generate a frictional force therewith,
   wherein the flat surface is shorter in a longitudinal direction of the piezoelectric element than in a lateral direction thereof, and
   wherein the flat surface is longer in the longitudinal direction of the piezoelectric element at a lateral center region thereof than at a lateral end region thereof.

2. A piezoelectric actuator according to claim 1, wherein the flat surface has a lateral length equal to or shorter than that of the active portion.

3. A piezoelectric actuator according to claim 1, wherein the second region overlaps a center of the active portion as seen from a direction orthogonal to the one outer surface.

* * * * *